(12) United States Patent
Levinski et al.

(10) Patent No.: US 7,433,039 B1
(45) Date of Patent: Oct. 7, 2008

(54) APPARATUS AND METHODS FOR REDUCING TOOL-INDUCED SHIFT DURING OVERLAY METROLOGY

(75) Inventors: Vladimir Levinski, Nazareth Ilit (IL); Ilan Sela, Haifa (IL)

(73) Assignee: KLA-Tencor Technologies Corporation, Milpitas, CA (US)

( * ) Notice: Subject to any disclaimer, the term of this patent is extended or adjusted under 35 U.S.C. 154(b) by 434 days.

(21) Appl. No.: 10/913,188

(22) Filed: Aug. 6, 2004

Related U.S. Application Data

(60) Provisional application No. 60/582,175, filed on Jun. 22, 2004.

(51) Int. Cl.
*G01B 11/00* (2006.01)
(52) U.S. Cl. ..................................................... 356/401
(58) Field of Classification Search ......... 356/399–401; 355/124, 54, 43, 55, 77; 430/522, 30; 250/205, 250/548
See application file for complete search history.

(56) References Cited

U.S. PATENT DOCUMENTS

| | | | |
|---|---|---|---|
| 6,842,247 B1 * | 1/2005 | Wehrens et al. | 356/400 |
| 6,937,337 B2 * | 8/2005 | Ausschnitt et al. | 356/401 |
| 7,009,704 B1 * | 3/2006 | Nikoonahad et al. | 356/401 |
| 2002/0060793 A1 * | 5/2002 | Fukui | 356/400 |
| 2003/0020889 A1 * | 1/2003 | Takashashi | 355/53 |
| 2004/0227944 A1 * | 11/2004 | Fukui et al. | 356/401 |
| 2005/0157296 A1 * | 7/2005 | Hayano | 356/401 |

FOREIGN PATENT DOCUMENTS

JP     H11-083439     3/1999

* cited by examiner

*Primary Examiner*—Tarifur R. Chowdhury
*Assistant Examiner*—Isiaka O Akanbi
(74) *Attorney, Agent, or Firm*—Weaver Austin Villeneuve & Sampson LLP

(57) ABSTRACT

Disclosed are apparatus and methods for determining a minimum tool-induced shift (TIS) during an overlay metrology procedure. In a specific embodiment, a method of determining overlay or misalignment error on a target is disclosed. For a predefined number of positions of a target within a field of view (FOV) of a metrology tool, the following operations are performed: (i) determining a tool-induced shift (TIS) parameter value for each predefined position of the target within the FOV based on at least one overlay measurement obtained from the target at the each position (for example, based on overlay measurements at 0 and 180 degrees of wafer orientation) and (ii) determining a minimum TIS parameter value and its corresponding FOV position from the plurality of determined TIS parameters values at the predefined positions of the target within the FOV. The FOV position that corresponds to the minimum TIS is then defined as an appropriate position for the actual overlay measurement and the value of minimum TIS is used for overlay correction.

28 Claims, 8 Drawing Sheets

TIS X
```
   1.1087   1.1721  -0.0811  -0.2905  -0.5424
   1.2142   2.0685   1.7232   0.5867  -0.3486
   1.0081   0.2774   0.2549   1.0042   2.0732
   1.6786   0.4014   0.7590   1.6297   1.8367
   1.8529   2.7208   2.8102   0.8853  -0.7790
```

TIS Y
```
   1.2165   0.7251  -0.4426   0.0970  -0.3960
   1.7273   1.4669   1.8519   1.3906   0.4318
   0.8115   1.8213   1.9414   2.0281   0.1311
   0.6353   1.9694   1.5204   1.9658  -1.2225
   1.0969   1.5487   1.8214   1.8569  -1.3978
```

X TIS
```
  26.7720   25.0360   25.4815   24.8058   24.6540
  15.5219   16.0415   16.5406   16.7431   15.4765
   4.7353    4.9000    4.6448    5.3038    6.0196
  -4.7612   -5.5507   -6.8451   -7.1686   -6.9774
 -15.6847  -15.6159  -14.9324  -14.6526  -16.2859
```

Y TIS
```
 -33.5573  -22.3524  -10.9071   -1.6434    9.3563
 -31.9016  -22.7133  -10.7597   -1.0084    9.8254
 -32.0544  -22.4419   -9.5022    0.5621    9.1745
 -33.3433  -21.3038  -10.8782    0.4048    9.8268
 -32.6307  -19.5990  -10.2095    0.9133    9.3018
```

APPARATUS AND METHODS FOR REDUCING TOOL-INDUCED SHIFT DURING OVERLAY METROLOGY

CROSS REFERENCE TO RELATED PATENT APPLICATION

This application claims priority of U.S. Provisional Patent Application Number 60/582,175, entitled APPARATUS AND METHODS FOR REDUCING TOOL-INDUCED SHIFT DURING OVERLAY METROLOGY, filed Jun. 22, 2004 by Vladimir Levinski, et al., which application is incorporated herein by reference in its entirety for all purposes.

BACKGROUND OF THE INVENTION

The present invention relates generally to the field of semiconductor metrology and inspection. More specifically, it relates to techniques for minimizing tool-induced shift during overlay metrology.

Lithography tools used in the manufacture of integrated circuits have been around for some time. Such tools have proven extremely effective in the precise manufacturing and formation of very small details in the product. In most lithography tools, a circuit image is written on a substrate by transferring a pattern via a light beam. For example, the lithography tool may include a light source that projects a circuit image through a reticle and onto a silicon wafer coated with photoresist. The exposed photoresist typically forms a pattern that masks the layers of the wafer during subsequent processing steps, as for example deposition and/or etching. As is generally well known, materials are deposited onto the layers of the wafer during deposition and materials are selectively removed from the layers of the wafer during etching.

The measurement of overlay between successive patterned layers on a wafer is one of the most critical process control techniques used in the manufacturing of integrated circuits and devices. Overlay generally pertains to the determination of how accurately a first patterned layer aligns with respect to a second patterned layer disposed above or below it. Presently, overlay measurements are performed via targets that are printed together with layers of the wafer. The most commonly used overlay target pattern is the "Box-in-Box" target, which includes a pair of concentric squares (or boxes) that are formed on successive layers of the wafer. The overlay error is generally determined by comparing the position of one square relative to the other square. This may be accomplished with an overlay metrology tool that measures the relative displacement between the two squares.

Most overlay measurements are performed immediately after the photoresist is developed, i.e., the photoresist is developed away in the area where it was exposed to the light thus leaving the overlay pattern in the photoresist. Overlay measurements can also be performed after process steps such as etch, when no photoresist is present.

To facilitate discussion, FIG. 1 is a top view of a typical "Box-in-Box" target 2. As shown, the target 2 includes an inner box 4 disposed within an open-centered outer box 6. The inner box 4 is printed on the top layer of the wafer while the outer box 6 is printed on the layer directly below the top layer of the wafer. As is generally well known, the overlay error between the two boxes, along the x-axis for example, is determined by calculating the locations of the edges of lines $c_1$ and $c_2$ of the outer box 6, and the edge locations of the lines $c_3$ and $c_4$ of the inner box 4, and then comparing the average separation between lines $c_1$ and $c_3$ with the average separation between lines $c_2$ and $c_4$. Half of the difference between the average separations $c_1$ & $c_3$ and $c_2$ & $c_4$ is the overlay error (along the x-axis) at that point. Thus, if the average spacing between lines $c_1$ and $c_3$ is the same as the average spacing between lines $c_2$ and $c_4$, the corresponding overlay error tends to be zero. Although not described, the overlay error between the two boxes along the y-axis may also be determined using the above technique.

A significant factor which affects the accuracy of the measured overlay is referred to as "tool-induced shift" or TIS which depends on the optical aberrations present in the optical column of the metrology tool. TIS generally causes the measured overlay to shift and results in the measured overlay differing from the "real" overlay value. TIS is also target dependent and some targets will have a greater or lesser overlay shift on the same metrology tool.

One goal in overlay metrology is to reduce the amount of TIS present in the measured overlay value. One technique includes searching for a focus position on the metrology tool which results in the best (or lowest) TIS. Although this technique works well to reduce TIS, it has several disadvantages. Changing the measurement focus position also affects the TIS corrected overlay value. Since each metrology tool requires a different optimal focus position, the effect on the overlay cannot be readily ascertained and subtracted from the overlay result across various metrology tools. Additionally, a small adjustment of the focus position can cause a significant reduction in the image contrast and adversely affect the measurement precision.

In view of the foregoing, there is a need for improved mechanisms for reducing TIS during overlay metrology. Additionally, reducing the TIS during overlay metrology without changing the measurement focus position is also desirable.

SUMMARY OF THE INVENTION

Accordingly, apparatus and methods for obtaining a minimum tool-induced shift (TIS) during an overlay metrology procedure are provided. In a specific embodiment, a method of determining overlay or misalignment error on a target is disclosed. For a predefined number of positions of a target within a field of view (FOV) of a metrology tool, the following operations are performed: (i) determining a tool-induced shift (TIS) parameter value for each predefined position of the target within the FOV based on at least one overlay measurement obtained from the target at the each position (for example, based on overlay measured at 0 and 180 degrees of wafer orientation) and (ii) determining a minimum TIS parameter value and its corresponding FOV position from the plurality of determined TIS parameters values at the predefined positions of the target within the FOV. The FOV position of the minimum TIS may then be defined as an appropriate position for the actual overlay measurement and the value of minimum TIS may then be used for overlay correction.

In a specific embodiment, the TIS parameter for each predefined position is determined by calculating an average of an overlay measurement of the target in a first orientation and an overlay measurement in a second orientation. The second orientation is 180 degrees from the first orientation. The actual overlay is then determined by subtracting the minimum TIS parameter from the overlay measurement of either the first or second orientation obtained at the position corresponding to the minimum TIS parameter.

In a further embodiment, the target is moved within the field to the predefined number of positions by moving a stage holding the target relative to an optical column of the metrology tool, wherein the movement of the stage is constrained to a plane that is perpendicular to the optical column with no vertical movement in a direction perpendicular to the plane being performed by the stage or the optical column. In another embodiment, a target is located at each predefined position and the TIS parameter for each predefined position is determined without moving the targets relative to an optical column of the metrology tool.

In another implementation, the predefined positions form a grid array within the FOV of the metrology tool. In a further aspect, a TIS parameter is determined in the y direction and a TIS parameter is determined in the x direction for each predefined position of the target. In this aspect, the minimum TIS is obtained from the determined TIS parameters in the y direction and the determined TIS parameters in the x direction. In a specific implementation, the best FOV position corresponding to the minimum TIS value is determined as the position of minimum of $TIS=\sqrt{XTIS^2+YTIS^2}$. In another implementation the positions of minimum TIS values can be found for each direction separately.

In another aspect, the invention pertains to a system operable to determine overlay or misalignment error on a target. The system includes one or more processors and one or more memory configured to perform one or more of the above method operations. In a specific implementation, the system is an optical metrology tool, and in another implementation the system is a scanning electron microscope. In a further aspect, the system further includes an imaging system arranged to generate an optical beam and image of the target at each predefined position. In a specific implementation, the imaging system includes (i) a source of illumination oriented to direct radiation onto a specified location of the target at each predefined position; and (ii) one or more detectors oriented to detect an output beam from the target at each predefined position in response to the incident source beam which has been scattered by the target at each predefined position These and other features and advantages of the present invention will be presented in more detail in the following specification of the invention and the accompanying figures which illustrate by way of example the principles of the invention.

DETAILED DESCRIPTION OF SPECIFIC EMBODIMENTS

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1:
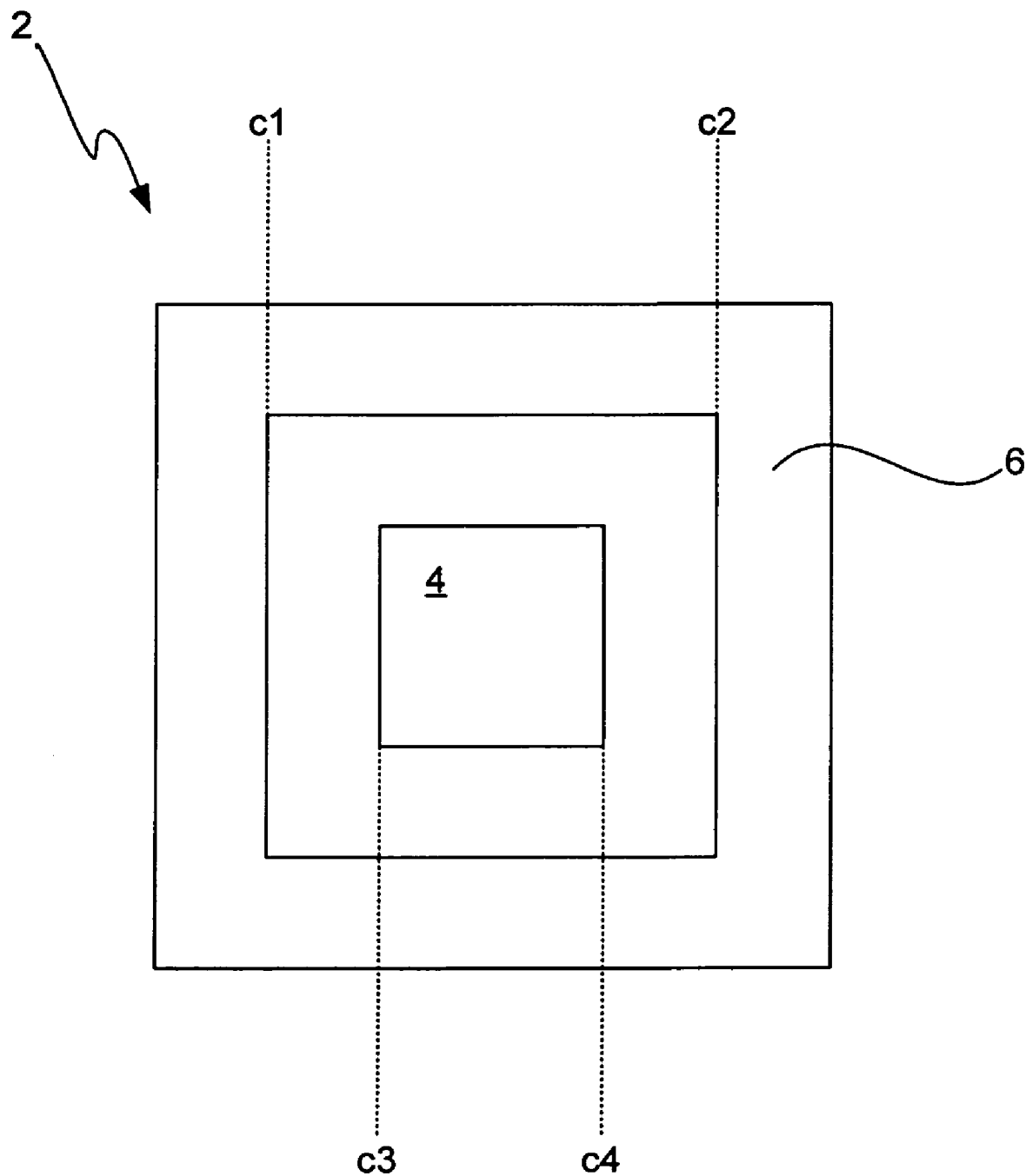
FIG. 1 is a top view of a typical "Box-in-Box" target for determining overlay.

The present invention provides techniques for obtaining a minimum tool-induced shift (TIS) value for a particular overlay target and particular overlay metrology tool. The overlay target may have any suitable shape or size. For instance, the overlay target may be a box-in-box type target having two layers as illustrated in FIG. 1.

In general, an overlay target has a shape and size so as to facilitate measurement of misalignment between two layers. Of course, misalignment may be measured between more than two layers, e.g., all the layers of the device. In a two layer example, each overlay target is formed from a first layer structure and a second subsequent layer structure. Additionally, the structures on the different layers of an overlay target may be designed to have a same center of symmetry. Thus, in a two layer target, the first layer target structures would have a same center of symmetry as the second layer target structures. Additionally, the target portions in the two different layers are preferably proximate to each other so that they may be measured together, e.g., within a single field. Although not required, the two different layer structures of each overlay target are preferably not on top of each other. In one implementation, the first layer structures are at a different rotational position with respect to the center of symmetry than the second layer structures. In another embodiment, the targets may be placed over the top of one another for Moire or scatterometry type measurements.

Each target is generally placed in a layer which is measurable or inspectable by a particular type of tool. For example, the target may have to be on a top layer or be covered with only optically transparent layers so that the target may be inspected by an optical tool. In other applications, the target may be required to be underneath an opaque layer so that the opaque layer's conformance to the underlying target may be inspected and/or measured. Additionally, each metrology tool typically has a size constraint as to the measured or inspected structure. That is, structures below a particular size cannot be seen. Therefore, the targets are sized so that they can be measured or inspected by the relevant tool.

Suitable overlay targets are described in the following U.S. patents and applications: (1) U.S. Pat. No. 6,462,818, issued 8 Oct. 2002, entitled "OVERLAY ALIGNMENT MARK DESIGN", by Bareket, (2) U.S. Pat. No. 6,023,338, issued 8

Feb. 2000, entitled "OVERLAY ALIGNMENT MEASUREMENT OF WAFER", by Bareket, (3) Application No. 09/894,987, filed 27 Jun. 2001, entitled "OVERLAY MARKS, METHODS OF OVERLAY MARK DESIGN AND METHODS OF OVERLAY MEASUREMENTS", by Ghinovker et al., (4) U.S. Pat. No. 6,486,954, issued 26 Nov. 2002, entitled "OVERLAY ALIGNMENT MEASUREMENT MARK" by Levy et al., (5) Application No. 10/367,124, filed 13 Feb. 2004 by Mike Adel et al, and (6) Application No. 10/785,396 filed 23 Feb. 2004 by Walter D. Mieher et al. These patents and applications are all incorporated herein by reference in their entirety.

Tool-induced shift or TIS is a quantization of the effect of a metrology tool's optical aberration on an overlay measurement of a particular target type. That is, the tool's optical aberration will cause a shift in the measured overlay value as compared to the actual overlay value that is present on the target. Many examples exist today of methods used to quantitatively measure these optical aberrations although measurement of the actual aberrations is not required for practice of the present invention. Three examples of these, each based on slightly different physical principles are the Litel reticle concept described in, "In Situ Measurement of Lens Aberrations", N. R. Farrar, Hewlett-Packard Co.; A. H. Smith, Litel Instruments; D. R. Busath, KLA-Tencor Corp. [4000-03], March 2000, Proceedings of SPIE Vol. 4000, Optical Microlithography XIII; the Artemis concept described in SPIE vol. 3679 (1999) p. 77-86 "Novel Aberration Monitor for Optical Lithography" Peter Dirksen et al.; and the phase shift grating concept described in Optical Review No. 8 Vol. 4 (2001) p. 227-234 "Measurement of Wavefront Aberrations in Lithographic Lenses with an Optical Inspection Tool," Hiroshi Nomura. These publications are incorporated herein by reference for all purposes. In each case the output of the analysis tool are typically provided in terms of Zernike polynomial coefficients, which can accurately describe the induced phase error across the exit pupil of the lithographic lens in a form which can be easily interpreted in optically meaningful terms such as spherical, astigmatic and coma aberrations.

The TIS that is present for a particular target is dependent on several factors. Different targets will tend to have different associated TIS values. Additionally, a particular overlay target will have different TIS at different target positions with respect to the tool's field of view (FOV). This FOV dependency is used advantageously by the techniques of the present invention to achieve a minimum TIS for a particular target.

Figure 2:
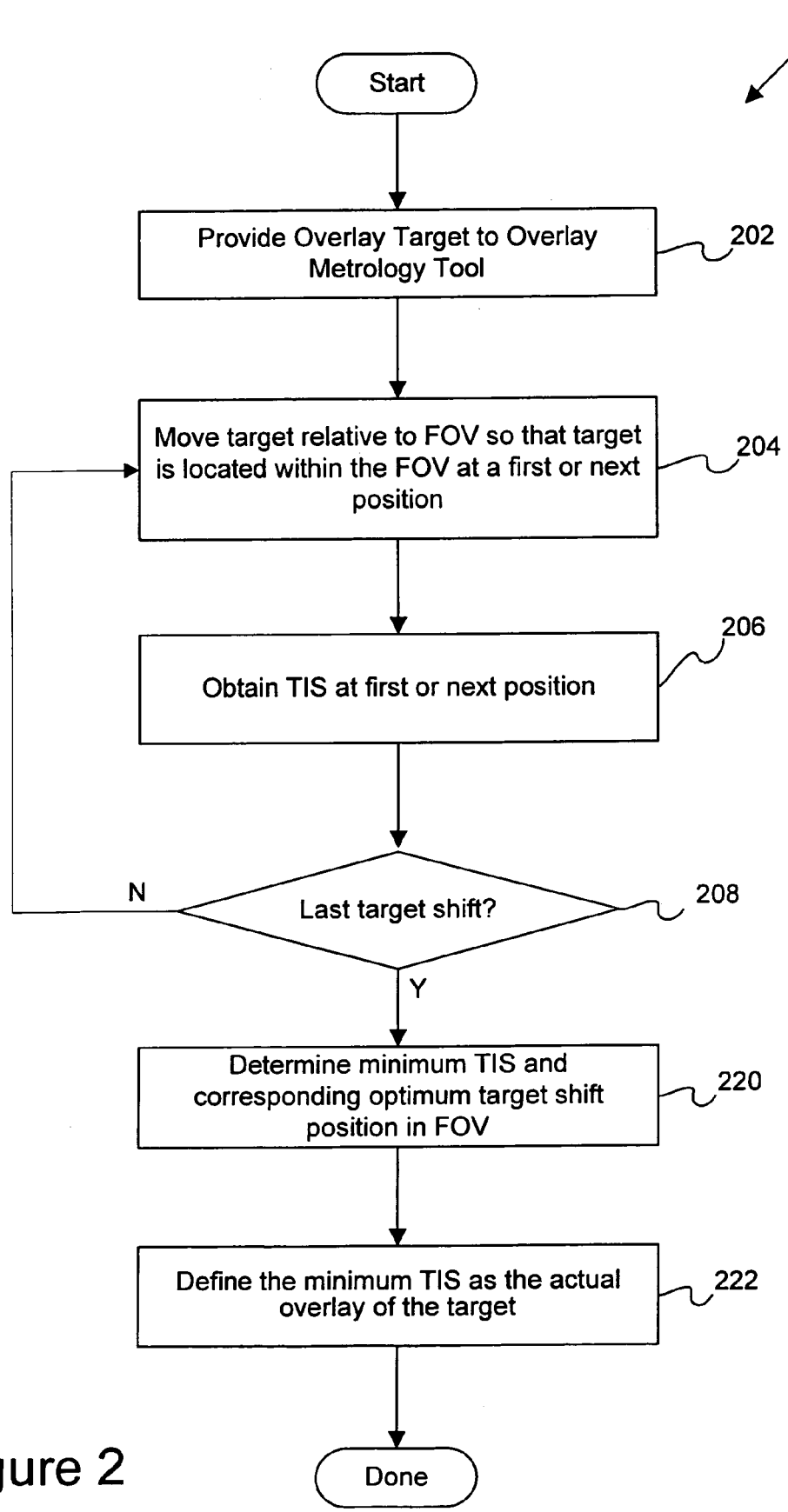
FIG. 2 is a flowchart illustrating a procedure for obtaining a minimum tool-induced shift (TIS) value for a particular target in accordance with one embodiment of the present invention.

FIG. 2 is a flowchart illustrating a procedure 200 for obtaining a minimum tool-induced shift (TIS) value for a particular target in accordance with one embodiment of the present invention. Initially, an overlay target is provided to an overlay metrology tool in operation 202.

An overlay target may be provided at any suitable stage in the fabrication process. For example, overlay measurements may be performed immediately after the photoresist is developed, i.e., the photoresist is developed away in the area where it was exposed to the light, thus. leaving the overlay pattern in the photoresist. In some cases, the overlay measurements are used to correct the process in order to keep the overlay errors within desired limits. For example, the overlay measurements may be fed into an analysis routine that calculates correctables and other statistics, which are used by the operator and/or the lithography tool to correct the alignment of the tool, thus, allowing wafer processing to proceed within desired limits. If the overlay error is too great, the analysis results may indicate that the wafer needs to be reworked, i.e., strip or remove the resist and start over on that layer. Reworking is typically expensive and undesirable, but it is better than destroying the wafer. Overlay measurements can also be performed after process steps such as etch when no photoresist is present. In this case, reworking is not possible, but the added information aids in the finer tuning of the overall process.

A typical semiconductor process includes wafer processing by lot. A lot is a group of typically 25 wafers which are processed together. Each wafer in the lot is comprised of many exposure fields from the lithography processing tools (e.g. steppers, scanners, etc.). Within each exposure field can be typically 1 to many die. A die is the finctional unit which eventually becomes a single chip. On product wafers, overlay metrology marks or targets are typically placed in the scribe line area (for example in the 4 corners of the field). This is a region that is typically free of circuitry around the perimeter of the exposure field (and outside the die). Sometimes overlay targets are placed in the streets, which are regions between the die but not at the perimeter of the field. It is fairly rare for overlay targets to be placed on product wafers within the prime die areas, as this area is critically needed for circuitry. However, micro sized targets may be placed within the die areas, for example, as described in co-pending U.S. application Ser. No. 10/858,836, entitled APPARATUS AND METHODS FOR PROVIDING IN-CHIP MICROTARGETS FOR METROLOGY OR INSPECTION, filed 1 Jun. 2004 by Avi Cohen et al., which application is incorporated herein by reference in its entirety.

Irrespective of the particular fabrication stage or particular target position within the wafer, an overlay target is provided to the metrology tool generally by placing the wafer on a movable stage of the metrology tool. Referring back to FIG. 2, the target is moved relative to the field of view (FOV) of the tool so that the target is located within the FOV at a first position in operation 204. In one embodiment, the target will eventually be moved to a number of specific locations within the FOV. The specific locations are preferably predefined.

The predefined positions of the target with respect to the FOV of the metrology tool may take any suitable form. In one implementation, the predefined positions form an array within the FOV. Of course, other patterns, besides a rectangular or square shaped pattern, of predefined positions may be utilized and this example is not meant to limit the scope of the invention. The FOV of may be any suitable size so as to allow movement of the target to a number of specified positions within the FOV so that a minimum TIS may be readily determined. In a specific implementation, the FOV has a size that is twice as large as the target size. For instance, if the target has a size of 20 μm by 20 μm, the FOV is 40 μm by 40 μm.

Figure 3:
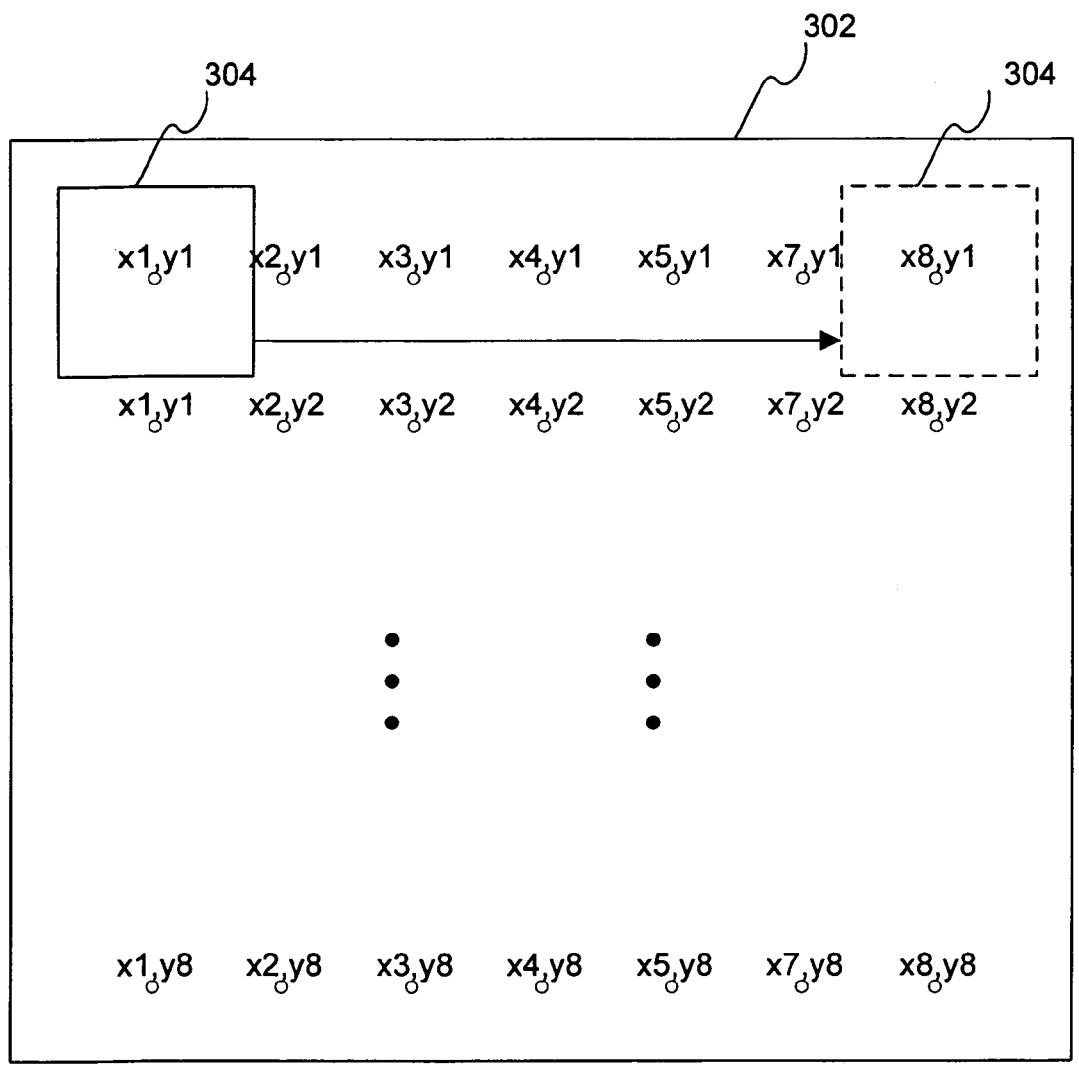
FIG. 3 is a top view illustration of a plurality of predefined positions for a target within a metrology tool's FOV in accordance with a specific implementation of the present invention.

FIG. 3 is a top view illustration of a plurality of predefined positions for a target 304 within a metrology tool's FOV in accordance with a specific implementation of the present invention. As shown, a plurality of XY target positions, such as position $X_1,Y_1$ and position $X_2,Y_1$, are defined within FOV 302 In this example, the predefined positions form an 8 by 8 array within FOV 302. In this example, the target 304 may initially be moved to any of these positions, such as $X_1,Y_1$.

Referring back to FIG. 2, after the target is moved to a first position, a TIS value is obtained for this first location (e.g., $X_1,Y_1$) in operation 206. The TIS may be obtained using any suitable algorithm. In one implementation, the TIS is obtained by obtaining an average of the overlay in a first target rotational orientation (e.g., 0 degrees) and the target at a second rotational orientation that is 180 degrees from the first rotational orientation (e.g., 180 degrees):

$$TIS=[Overlay(0')+Overlay(180')]/2$$

Since targets will present an opposite overlay when rotated 180 degrees, overlay (and TIS) may be measured at both 0 and 180 degrees and averaged together to obtain a TIS value for a particular FOV position. In theory if there is no TIS present, the overlay measurement from the 0 degree orientation will cancel the overlay measurement from the 180 degree orientation. Since TIS is the same for both orientations, adding the TIS values from the two orientations would result in twice the actual TIS value. Accordingly, the TIS value resulting from adding the measured overlays (and TIS) from the two orientations is divided by two by averaging the two measured overlay values (and TIS components) although this division operation is not strictly necessary.

Figure 4:
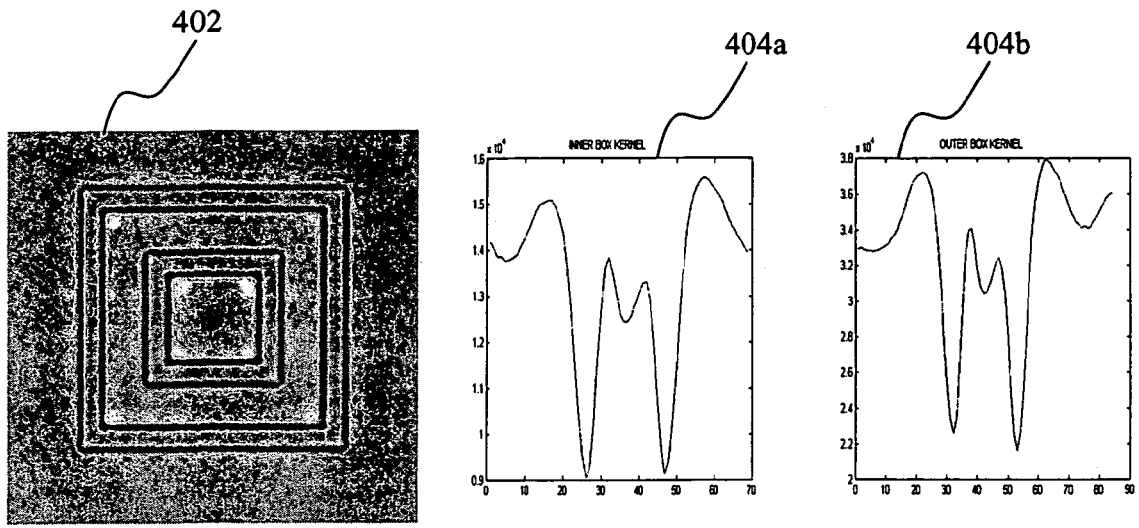
FIG. 4 is a top view illustration of a target and its resulting TIS values at a plurality of x and y positions in accordance with one implementation of the present invention.
Figure 5A:
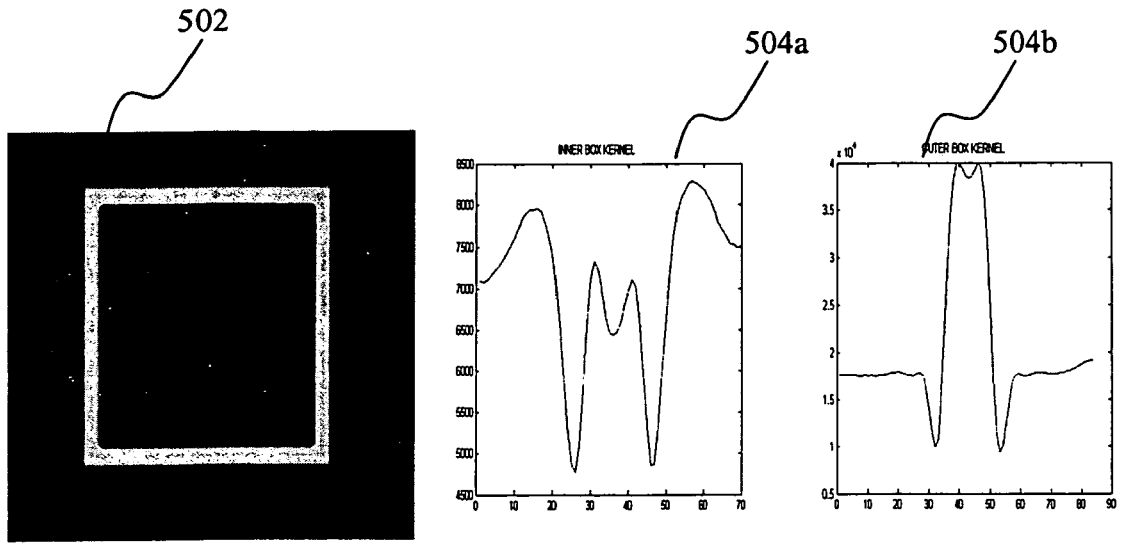
FIG. 5A is a top view illustration of a target that differs from the target of FIG. 4 and its resulting TIS values at a plurality of x and y positions in accordance with one implementation of the present invention.

A TIS value may also be obtained for more than one direction. For example, a TIS in the y direction and a TIS in the x direction may be obtained for each target position. FIG. 4 illustrates a target 402 and example edge projections for the inner and outer boxes kernels, 404a and 404b, respectively. FIG. 4 also shows a table 406 for the x direction TIS values and the y direction TIS values obtained at a plurality of target positions within the FOV. The TIS values typically vary with target type. As shown in FIG. 5A, a target 502 which has a different size and shape than the target 402 of FIG. 4 results in significantly different edge projections 504a and 504b and resulting TIS values 506. Thus, the procedure of FIG. 2 is preferably performed for each significantly different type of target. However, this approach may simply be performed once for a particular type of target with the results applied to subsequently measured targets of the same type.

After a TIS value is obtained at the first position, it is then determined whether this is the last target shift position in operation 208. Since there are a plurality of target shift positions and this is merely the first target position, it is determined that this not the last target shift position. The target is then moved relative to the FOV of the metrology tool to a next shift position in operation 204. A TIS value (or TIS values in both the x and y directions) is then obtained for this next target position in operation 206. Operations 204 and 206 are repeated for each target shift position until the last target shift position is reached.

In another implementation, overlay is measured in all predefined FOV positions at 0 and 180 degrees of wafer orientation and TIS is calculated in all these positions by summarizing OVL matrix for 0 degree orientation with the transported matrix for 180 degrees orientation.

After TIS values are obtained for each target shift position relative to the FOV, a minimum TIS value is then determined in operation 220. This minimum TIS value is then used to determine the actual overlay value in operation 222. For example, the minimum TIS is then subtracted from the measured overlay value obtained from either the 0 or 180 degree (or from any other suitable orientation) at an FOV position corresponding to the minimum TIS.

The actual overlay value may be used for any suitable application, such as lot deposition, process excursion determination or to calculate lithography tool correctables. Techniques for applying overlay measurements are described in U.S. patent application Ser. No. 10/438,962, entitled USE OF OVERLAY DIAGNOSTICS FOR ENHANCED AUTOMATIC PROCESS CONTROL, filed 14 May 2003 by Joel L. Seligson et al., which application is incorporated herein in its entirety for all purposes.

Figure 5B:
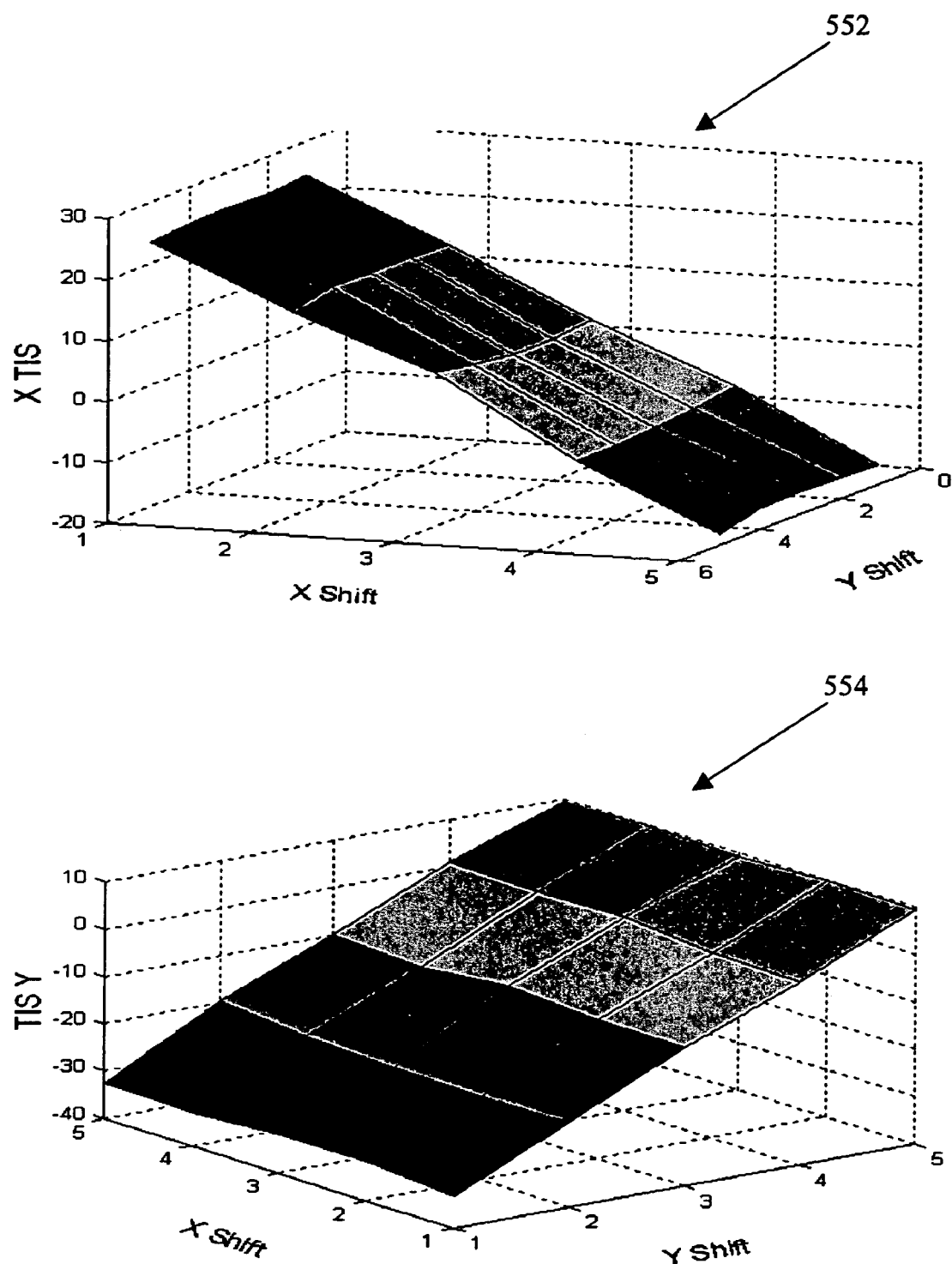
FIG. 5B show a first graph of TIS values measured and interpolated in the x direction and a second graph of TIS values measured and interpolated in a y direction for a plurality of target x and y positions in accordance with a specific implementation of the present invention.
Figure 6A:
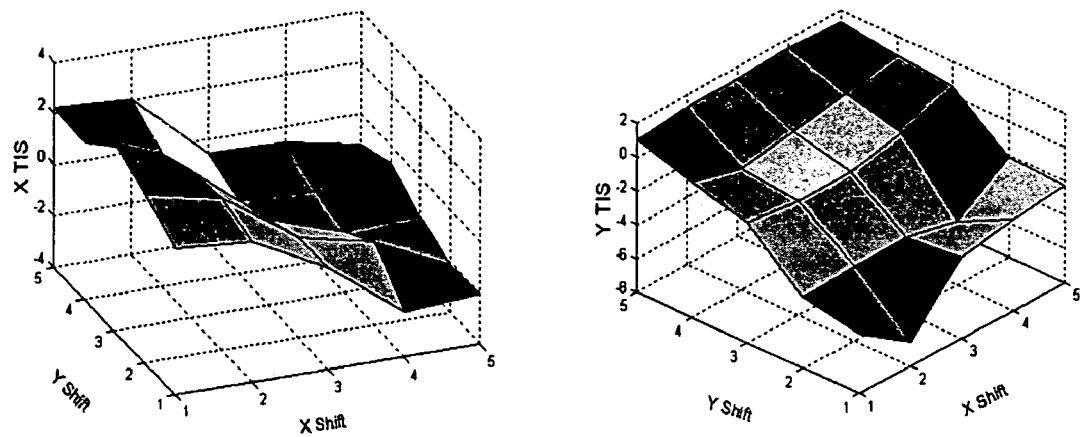
FIGS. 6A and 6B illustrate graphs of x and y TIS values for two different types of targets in accordance with other implementations of the present invention.
Figure 6B:
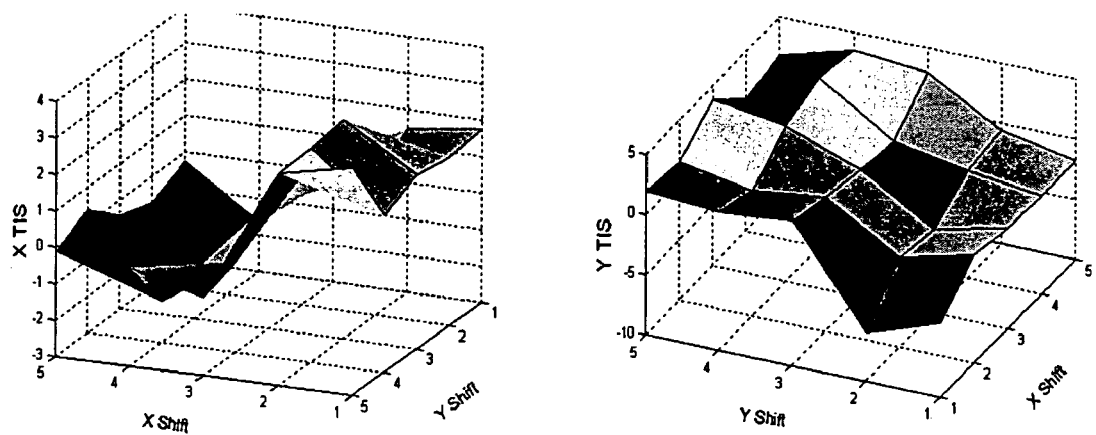

A minimum TIS may be found among a plurality of TIS values obtained in one or more directions, such as the x and y directions. For instance, the measured TIS values may be graphed and other non-measured TIS values interpolated from such measured TIS values using any suitable interpolation technique. FIG. 5B show a first graph 552 of TIS values measured and interpolated in the x direction and a second graph 554 of TIS values measured and interpolated in a y direction for a plurality of target x and y positions in accordance with a specific implementation of the present invention. FIGS. 6A and 6B illustrate graphs of x and y TIS values for two different types of targets in accordance with other implementations of the present invention.

In the case where is no coupling between shifts in X and Y directions, i.e. shift in X direction affects only XTIS value and shift in Y direction affects only YTIS value, a minimum TIS value may be found by the following equations, where $XTIS_{min}$ is the minimum TIS value in the x direction and $YTIS_{min}$ is the minimum TIS value in the y direction:

$$TIS_{min} = \sqrt{XTIS_{min}^2 + YTIS_{min}^2}$$

Otherwise one can seek for the position in FOV where the value of a pulled TIS $$TIS = \sqrt{XTIS^2 YTIS^2}$$

achieves its minimum.

Alternatively, the overall minimum TIS (e.g., a minimum TIS for the x and y direction) may be determined in any suitable manner, such as taking an average or mean of the TIS in the x direction and the TIS in the y direction, taking the minimum of these two TIS values, etc.

The above described techniques include moving a single target to multiple FOV positions to thereby sequentially measure a TIS value at each position. In an alternative embodiment, a small target is placed at each target position within the FOV. For example, a grid of smaller targets is used, instead of a single larger target. Other target placement patterns, besides a grid pattern, may be used. In this embodiment, the set of targets are moved to be within the FOV of the tool. A TIS value is then obtained for each target in the grid, or other placement pattern. In this implementation, it is not necessary to scan or move a target to each position since a target is already located at each position.

Embodiments of the present invention allow an optimum TIS to be achieved by simply moving the target with respect to the FOV of the metrology tool or placing targets at a plurality of FOV positions. The focus of the tool does not require adjustment to achieve a minimum TIS. Since the focus is not changed, the final overlay or minimum TIS value is more reliable than a minimum TIS which is achieved by adjusting the focus and thereby causes in some cases a change in the measured TIS value. Additionally, since TIS corrected overlay is almost independent of FOV position as opposed to the different optimal focus positions and each tool has a different optimal focus for achieving TIS, tool matching may be achieved more readily for the determined optimal TIS and corresponding target position. Since the focus position is not changed and only the target FOV position is changed, the target image contrast is not adversely affected as compared to when the focus is changed. Accordingly, the resulting measurement precision is not adversely affected by a degradation in image contrast. Finally, the present invention provides two degrees of freedom (movement in an x and y direction) for determining a minimum TIS, as compared with a single degree of freedom by adjustment of focus (movement in the z direction).

Suitable computer systems for use in implementing and controlling the methods in the present invention (e.g., moving a target within the FOV, obtaining TIS, obtaining a minimum TIS and corresponding target position within the FOV, etc.) may be obtained from various vendors. In one preferred embodiment, an appropriately programmed Silicon Graphics 0-200 computer (Mountain View, Calif.) or Sun SPARC (Sun Microsystems, Sunnyvale, Calif.) may be employed. In any case, the computer system preferably has one or more processors coupled to input/output ports, and one or more memories via appropriate buses or other communication mechanisms.

Preferably, an optical inspection or metrology system is integrated with a computer system which implements many of the method steps of this invention. Such composite system preferably includes at least (a) a memory, (b) an imaging system arranged to generate an optical beam and image of the specimen, and (c) a processing unit configured to determine overlay error or TIS by analyzing the specimen image. At a minimum, the imaging system will usually include (i) a source of illumination oriented to direct radiation onto a specified location of the specimen; and (ii) one or more detectors oriented to detect an output beam from the specimen in response to the incident source beam which has been scattered by the specimen. The imaging system may also include a scanning mechanism for moving the optical beam across the specimen. The system may also include a stage movement mechanisms for moving the specimen under the beam column. A scanning electron microscope may also be used to measure overlay.

Figure 7:
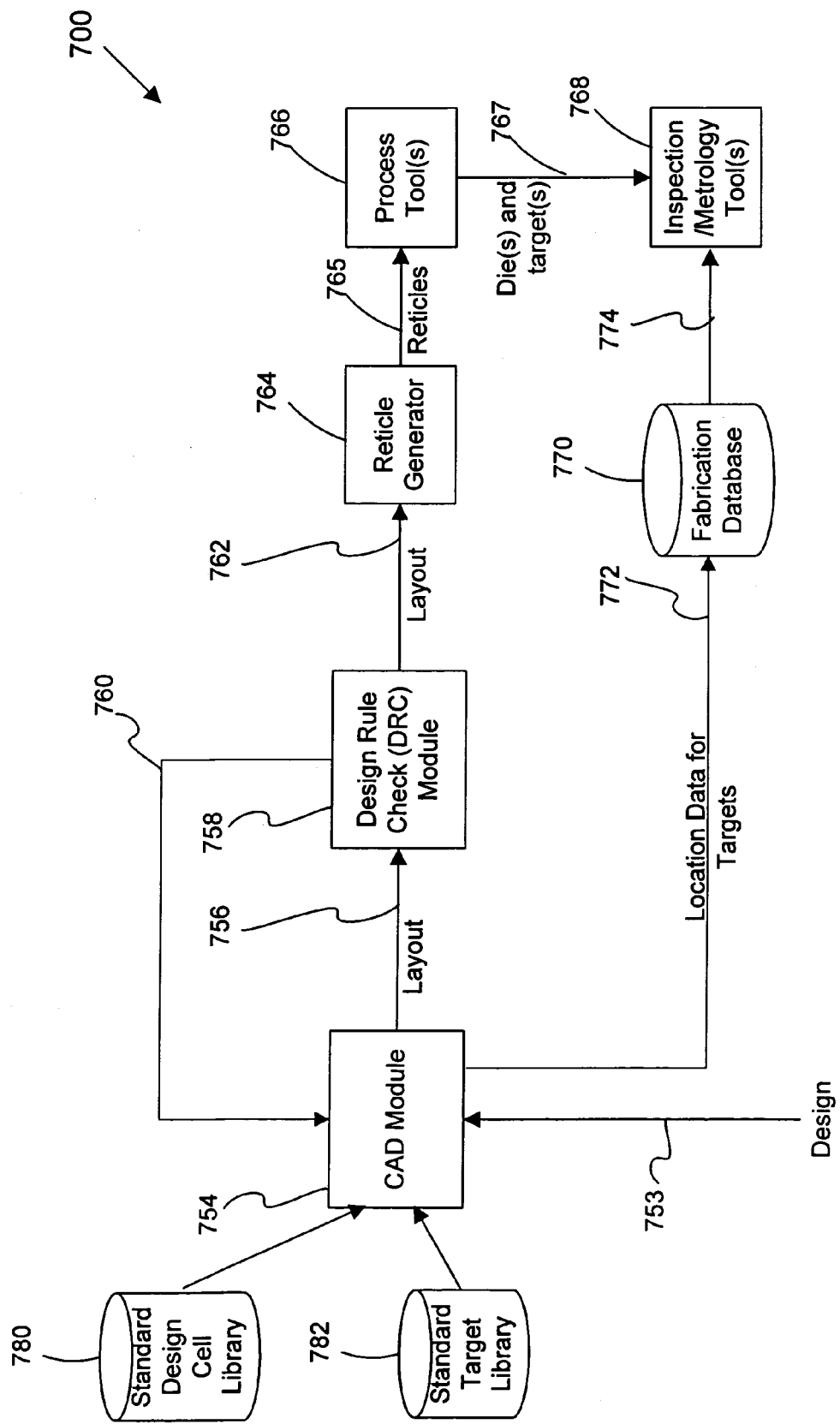
FIG. 7 is a diagrammatic representation of a design, fabrication, and metrology or inspection system in which techniques of the present invention may be implemented.

FIG. 7 is a diagrammatic representation of a design, fabrication, and metrology or inspection system 750 in which techniques of the present invention may be implemented. As shown, a design 753 of a die and targets is input into a computer aided design (CAD) module 754. This CAD module 754 may also have access to one or more databases containing standard layout patterns. In the illustrated embodiment, a standard design cell library 780 includes layout patterns for features within the active regions of the die and a standard target library 782 includes a number of different standard target layout patterns.

An integrated circuit (IC) device and target structure may be designed using any suitable design techniques. For example, an IC designer may use preexisting schematic library blocks to form the IC device and targets using, for example, electronic design automation (EDA) tools. In some cases, the IC designer may create an entire IC device target or part of an IC device or target from scratch with the aid of any suitable design system, such as conventional computer aided design (CAD) tools. For example, the IC designer may use a schematic CAD tool to plan the logic diagrams for a particular IC device lo or target. Still further, the IC designer may write a description of the IC device or target or portions of the IC device or target with the aid of a hardware design language, such as VHDL.

The IC designer then typically generates a layout pattern from the IC circuit design. The layout pattern may be composed of a plurality of electronic representations of IC layers that are later converted into a plurality of reticles that are used to fabricate a plurality of physical layers of an IC device and target. Each physical layer of the fabricated IC device corresponds to one of the reticles and an associated one of the electronic representations from the layout pattern. For example, one electronic representation may correspond to a diffusion pattern on a silicon substrate, another to a gate oxide pattern, another to a gate polysilicon pattern, another to a contact pattern on an interlayer dielectric, another to a line pattern on a metallization layer, and so on. The targets may be formed from any combination of one or more layers. For example, a special layer may be reserved for the target structures, or the targets may be formed from the dummy layer. Each electronic representation is composed of a plurality of polygons or other shapes (herein, referred to as "figures"), which together define the layout or reticle pattern.

The CAD module 754 is generally configured to generate a layout pattern either automatically or via input from a design engineer. Several suitable CAD products for designing IC products are available from Cadence of San Jose, Calif. and Mentor Graphics of Wilsonville, Oreg. The layout pattern 756 is then checked by a design rule check (DRC) module 758. For example, the IC designer may use the CAD module to manually lay out the layout patterns for the IC device and targets with or without preexisting library cells. Alternatively, a synthesis tool may automatically create layout patterns for the IC device and targets from scratch or by piecing together preexisting library cells based on the schematic design.

The DRC module is generally configured to determine whether the layout 756 conforms to a set of layout constraints. A feedback pathway 760 is provided to CAD module 754 for modification of the layout pattern 756 when the layout pattern fails to conform to the DRC. For example, the DRC module may indicate a number of nonconforming layout regions which may the be modified to comply with the design rules. The CAD module and DRC module may be contained within the same computer system. Of course, the CAD module and DRC module may be implemented in any suitable combination of hardware and software.

After the layout pattern is determined to conform to the design rules by the DRC module 758, the layout pattern 762 is passed to a reticle generator 764 in a form that is readable by the radical generator. For example, the layout may be in a GDSII format. The reticle generator then forms a plurality of reticles 765 based on the layout pattern 762. The reticles may be produced by any suitable pattern generator or reticle writer equipment, such as a MEBES 4500, commercially available from ETEC of Hayward, Calif.

The reticles may then be used by one or more process tools 766 to at least partially fabricate one or more die(s) and integrated targets 767. The integrated die(s) and targets may then be provided to one or more metrology tools 768 so that the targets may be measured to obtain an overlay or TIS value. Of course, the reticle targets 765 may also be inspected or measured.

Location data 772 for each target may also provided to the metrology tools 768 so that the targets may be found by the tool. In one specific embodiment, the location data is retained in fabrication database 770, which is accessible by the metrology tools 768. Alternatively, the location data may be directly provided or transferred to the metrology tools 768 or the targets may be found using any suitable pattern recognition techniques. The location of a particular target may be stored in any suitable format for identifying a position of the particular target. For example, the location may take the form of Cartesian or polar coordinates. The identity is generally used to distinguish between different types of targets. It may take the form of alphanumeric text which identifies the type of target, such as overlay, CD, etc., or the identity may take the form of a reference to a target image. By way of specific example, the location data may be in OpenAccess format, which is readable by inspection and metrology tools from KLA-Tencor.

Any suitable metrology tool may be utilized during any stage of the fabrication. Each tool may take the form of an optical system, such as a bright field or dark field optical system. The tool may also utilize both bright field and dark field modes. Examples of bright field systems include the 2350, 2351, 2360, and 2370 from KLA-Tencor, Corp. of San Jose, Calif. Examples of dark field system include the AIT II, AIT XP, Fusion, Fusion UV, and SPI PatternPro available from KLA-Tencor, Corp. of San Jose, Calif. Each tool may also take the form of an electron beam (ebeam) system, such as a scanning, snapshot, or step-and-repeat type ebeam system. Examples of ebeam systems include the eV300 and eS20XP available from KLA Tencor, Corp. of San Jose, Calif.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A method of determining overlay or misalignment error on a target, the method comprising:
    (a) moving a target to each of a plurality of field of view (FOV) positions within a particular field of view (FOV) of a metrology tool, wherein the FOV positions are different xy positions within a plane that is perpendicular to a focus z axis of the metrology tool;
    (b) at each FOV position, obtaining an overlay measurement at each of a plurality of orientations of the target located at such each FOV position, and
    (c) at each FOV position, determining a tool-induced shift (TIS) value based on the overlay measurements that were obtained at the plurality of target orientations of the target located at such each FOV position;
    (d) determining which of the FOV positions has a minimum determined TIS value; and
    (e) for the FOV position which has been determined to have the minimum TIS value, determining and storing an actual overlay of the target located at such FOV position by subtracting such minimum TIS value from at least one of the measured overlay measurements obtained at the FOV position which has been determined to have the minimum TIS value, wherein the actual overlay value is specified to correspond to a most accurate overlay measurement from the overlay measurements obtained for the plurality of the FOV positions.

2. A method as recited in claim 1, wherein moving the target to each of the FOV positions is accomplished by moving a stage holding the target relative to an optical column of the metrology tool so that the target is sequentially positioned at each FOV position, wherein the movement of the stage is constrained to a plane that is perpendicular to the optical column with no vertical movement in a direction perpendicular to the plane being performed by the stage or the optical column.

3. A method as recited in claim 1, wherein the FOV positions form a grid array within the particular FOV of the metrology tool.

4. A method as recited in claim 1, further comprising determining a TIS value in the y direction and a TIS value in the x direction for each FOV position at which a target is located, and wherein the minimum TIS value is obtained from the determined TIS values in the y direction and the determined TIS values in the x direction.

5. A method as recited in claim 1, wherein the TIS value for each FOV position is determined in the y direction.

6. A method as recited in claim 1, wherein the TIS value for each FOV position is determined in the x direction.

7. A method as recited in claim 1, wherein a target is located at each FOV position and the TIS value for each FOV position is determined by moving a plurality of targets once so that at least one of the targets is positioned at each of the FOV positions.

8. A method as recited in claim 1, wherein the TIS value for each FOV position is determined by calculating an average of an overlay measurement of a target in a first orientation and an overlay measurement in a second orientation that is 180 degrees from the first orientation, and wherein the actual overlay is determined by subtracting the minimum TIS value from the overlay measurement of either the first or second orientation obtained at the FOV position corresponding to the minimum TIS value.

9. A method as recited in claim 1, further comprising:
    moving a second target to the FOV position having the minimum TIS value;
    obtaining a second overlay measurement of the second target when the second target is located at the FOV position with the minimum TIS value; and
    subtracting the minimum TIS value from the second overlay measurement obtained at the FOV position with the minimum TIS value to determine the second actual overlay of the second target.

10. A method as recited in claim 1, wherein the target is moved to each of the FOV positions without changing a focus position of the metrology tool.

11. A metrology system operable to determine overlay or misalignment error on a target, comprising:
    one or more processors;
    one or more memory, wherein at least one of the processors and memory are adapted for:
        (a) moving a target to each of a plurality of field of view (FOV) positions within a particular field of view (FOV) of a the metrology system, wherein the FOV positions are different xy positions within a plane that is perpendicular to a focus z axis of the metrology tool;
        (b) at each FOV position, obtaining an overlay measurement at each of a plurality of orientations of the target located at such each FOV position, and
        (c) at each FOV position, determining a tool-induced shift (TIS) value based on the overlay measurements that were obtained at the plurality of target orientations of the target located at such each FOV position;
        (d) determining which of the FOV positions has a minimum determined TIS value; and
        (e) for the FOV position which has been determined to have the minimum TIS value, determining and storing an actual overlay of the target located at such FOV position by subtracting such minimum TIS value from at least one of the measured overlay measurements obtained at the FOV position which has been determined to have the minimum TIS value, wherein the actual overlay value is specified to correspond to a most accurate overlay measurement from the overlay measurements obtained for the plurality of the FOV positions.

12. A metrology system as recited in claim 10, wherein moving the target to each of the FOV positions is accomplished by moving a stage holding the target relative to an optical column of the metrology tool so that the target is sequentially positioned at each FOV position, wherein the movement of the stage is constrained to a plane that is perpendicular to the optical column with no vertical movement in a direction perpendicular to the plane being performed by the stage or the optical column.

13. A metrology system as recited in claim 11, wherein the FOV positions form a grid array within the particular FOV of the metrology tool.

14. A metrology system as recited in claim 11, further comprising determining a TIS value in the y direction and a TIS value in the x direction for each FOV position at which a target is located, and wherein the minimum TIS value is obtained from the determined TIS values in the y direction and the determined TIS values in the x direction.

15. A metrology system as recited in claim 11, wherein the TIS value for each FOV position is determined in the y direction.

16. A metrology system as recited in claim 11, wherein the TIS value for each FOV position is determined in the x direction.

17. A metrology system as recited in claim 11, wherein a target is located at each FOV position and the TIS value for each FOV position is determined by moving a plurality of targets once so that at least one of the targets is positioned at each of the FOV positions.

18. A metrology system as recited in claim 11, wherein the metrology system is an optical metrology tool.

19. A metrology system as recited in claim 11, wherein the metrology system is scanning electron microscope.

20. A metrology system as recited in claim 11, further comprising an imaging system arranged to generate an optical beam and image of the target at each FOV position, 21. A metrology system as recited in claim 20, wherein the imaging system includes (i) a source of illumination oriented to direct radiation onto a specified location of the target at each predefined position; and (ii) one or more detectors oriented to detect an output beam from the target at each predefined position in response to the incident source beam which has been scattered by the target at each predefined position.

22. A metrology system as recited in claim 11, wherein the TIS value for each FOV position is determined by calculating an average of an overlay measurement of a target in a first orientation and an overlay measurement in a second orientation that is 180 degrees from the first orientation, and wherein the actual overlay is determined by subtracting the minimum TIS value from the overlay measurement of either the first or second orientation obtained at the FOV position corresponding to the minimum TIS value.

23. A metrology system as recited in claim 11, wherein the at least one of the processors and memory are further adapted for:
moving a second target to the FOV position having the minimum TIS value;
obtaining a second overlay measurement of the second target when the second target is located at the FOV position with the minimum TIS value; and
subtracting the minimum TIS value from the second overlay measurement obtained at the FOV position with the minimum TIS value to determine the second actual overlay of the second target.

24. A method as recited in claim 23, wherein the TIS value for each FOV position is determined by calculating an average of an overlay measurement of a target in a first orientation and an overlay measurement in a second orientation that is 180 degrees from the first orientation, and wherein the actual overlay is determined by subtracting the minimum TIS value from the overlay measurement of either the first or second orientation obtained at the FOV position corresponding to the minimum TIS value.

25. A method as recited in claim 23, further comprising:
moving a second target to the FOV position having the minimum TIS value; and
obtaining an actual measurement of a characteristic of the second target, with a minimum TIS effect, when the second target is located at such FOV position having the minimum TIS value, by measuring a characteristic of the second target at such FOV position and correcting such characteristic based on the minimum TIS value.

26. An apparatus as recited in claim 11, wherein the target is moved to each of the FOV positions without changing a focus position of the metrology tool.

27. A method of measuring a characteristic on a target, the method comprising:
(a) moving a target to each of a plurality of field of view (FOV) positions within a particular field of view (FOV) of a metrology tool, wherein the FOV positions are different xy positions within a plane that is perpendicular to a focus z axis of the metrology tool;
(b) at each FOV position, obtaining an overlay measurement at each of a plurality of orientations of the target located at such each FOV position, and (c) at each FOV position, determining a tool-induced shift (TIS) value based on the overlay measurements that were obtained at the plurality of target orientations of the target located at such each FOV position;
(d) determining which of the FOV positions has a minimum determined TIS value; and
(e) for the FOV position which has been determined to have the minimum TIS value, determining and storing an actual overlay of the target located at such FOV position by subtracting such minimum TIS value from at least one of the measured overlay measurements obtained at the FOV position which has been determined to have the minimum TIS value, wherein the actual overlay value is specified to correspond to a most accurate overlay measurement from the overlay measurements obtained for the plurality of the FOV positions.

28. A method as recited in claim 27, wherein the target is moved to each of the FOV positions without changing a focus position of the metrology tool.

* * * * *